(12) United States Patent
Ueno et al.

(10) Patent No.: US 11,383,616 B2
(45) Date of Patent: Jul. 12, 2022

(54) VEHICLE BATTERY LIFE TRACKING SYSTEM

(71) Applicants: NISSAN NORTH AMERICA, INC., Franklin, TN (US); NISSAN MOTOR CO., LTD., Yokohama (JP)

(72) Inventors: Takafumi Ueno, Yokohama (JP); Kaori Wilson, Fremont, CA (US); David Nishijima, San Jose, CA (US)

(73) Assignees: NISSAN NORTH AMERICA, INC., Franklin, TN (US); NISSAN MOTOR CO., LTD., Kanagawa (JP)

( * ) Notice: Subject to any disclaimer, the term of this patent is extended or adjusted under 35 U.S.C. 154(b) by 132 days.

(21) Appl. No.: 16/865,065

(22) Filed: May 1, 2020

(65) Prior Publication Data

US 2021/0339649 A1  Nov. 4, 2021

(51) Int. Cl.
*H02J 7/00* (2006.01)
*B60L 58/16* (2019.01)
*B60L 58/12* (2019.01)
*B60L 58/24* (2019.01)

(52) U.S. Cl.
CPC ............... *B60L 58/16* (2019.02); *B60L 58/12* (2019.02); *B60L 58/24* (2019.02); *H02J 7/005* (2020.01); *H02J 7/00034* (2020.01); *H02J 7/0048* (2020.01); *H02J 7/007194* (2020.01); *H02J 7/00036* (2020.01); *H02J 2310/48* (2020.01)

(58) Field of Classification Search
CPC .......... B60L 58/16; B60L 58/12; B60L 58/24; H02J 7/00034; H02J 7/0048; H02J 7/005; H02J 7/007194; H02J 7/00036; H02J 2310/48
USPC .................................... 320/109, 132; 701/22
See application file for complete search history.

(56) References Cited

U.S. PATENT DOCUMENTS

| | | | |
|---|---|---|---|
| 7,498,767 B2 | 3/2009 | Brown et al. | |
| 8,970,341 B2 | 3/2015 | Park et al. | |
| 9,035,791 B2 | 5/2015 | Matsumoto et al. | |
| 9,285,430 B2 | 3/2016 | Loftus et al. | |
| 2014/0210638 A1* | 7/2014 | Gussen | B60L 3/0046 340/870.09 |
| 2015/0239365 A1* | 8/2015 | Hyde | B60L 7/12 701/2 |
| 2019/0033381 A1 | 1/2019 | Karner et al. | |
| 2019/0036178 A1* | 1/2019 | Karner | G01R 31/367 |

* cited by examiner

*Primary Examiner* — Zixuan Zhou
(74) *Attorney, Agent, or Firm* — Global IP Counselors, LLP

(57) ABSTRACT

A vehicle battery life tracking system includes a vehicle battery, an electronic control unit and a wireless communication unit. The vehicle battery has a plurality of individual battery units. The electronic control unit is provided to a vehicle having the vehicle battery. The electronic control unit is programmed to monitor and store chargeability information associated with the individual battery units. The wireless communication unit is provided to the vehicle. The electronic control unit is configured to control the wireless communication unit to upload the chargeability information to an external memory storage upon the occurrence of one or more predetermined incidents.

18 Claims, 17 Drawing Sheets

VEHICLE BATTERY LIFE TRACKING SYSTEM

BACKGROUND

Field of the Invention

The present invention generally relates to battery life tracking system. More specifically, the present invention relates to battery life tracking system for a vehicle battery.

Background Information

Vehicles, including cars, trains, aircraft, and ships, are powered by converting from combustible energy sources such as gasoline to using electric motors powered by batteries. For example, hybrid electric vehicles are now widely available that can use energy derived from a battery as well as another source, such as an internal combustion engine. In addition, full electrically-powered vehicles that use energy derived solely from a battery are also available to consumers. Many of these electric vehicles suffer from differing problems that prevent them from being widely adopted. Namely, replacement and repair of large lithium ion battery backs, such as those disposed within electric vehicles, can be quite expensive and cost prohibitive.

SUMMARY

In view of the state of the known technology, one aspect of the present disclosure is to provide a vehicle battery life tracking system comprising a vehicle battery, an electronic control unit and a wireless communication unit. The vehicle battery has a plurality of individual battery units. The electronic control unit is provided to a vehicle having the vehicle battery. The electronic control unit is programmed to monitor and store chargeability information associated with the individual battery units. The wireless communication unit is provided to the vehicle. The electronic control unit is configured to control the wireless communication unit to upload the chargeability information to an external memory storage upon the occurrence of one or more predetermined incidents.

In view of the state of the known technology, another aspect of the present disclosure is to provide a vehicle comprising a vehicle battery, an electronic control unit and a wireless communication unit. The vehicle battery is comprised of a plurality of individual battery units. The electronic control unit is for the vehicle. The electronic control unit is programmed to monitor and store chargeability information associated with the individual battery units. The wireless communication unit is configured to upload the chargeability information to an external memory storage upon the occurrence of pre-determined incidents.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
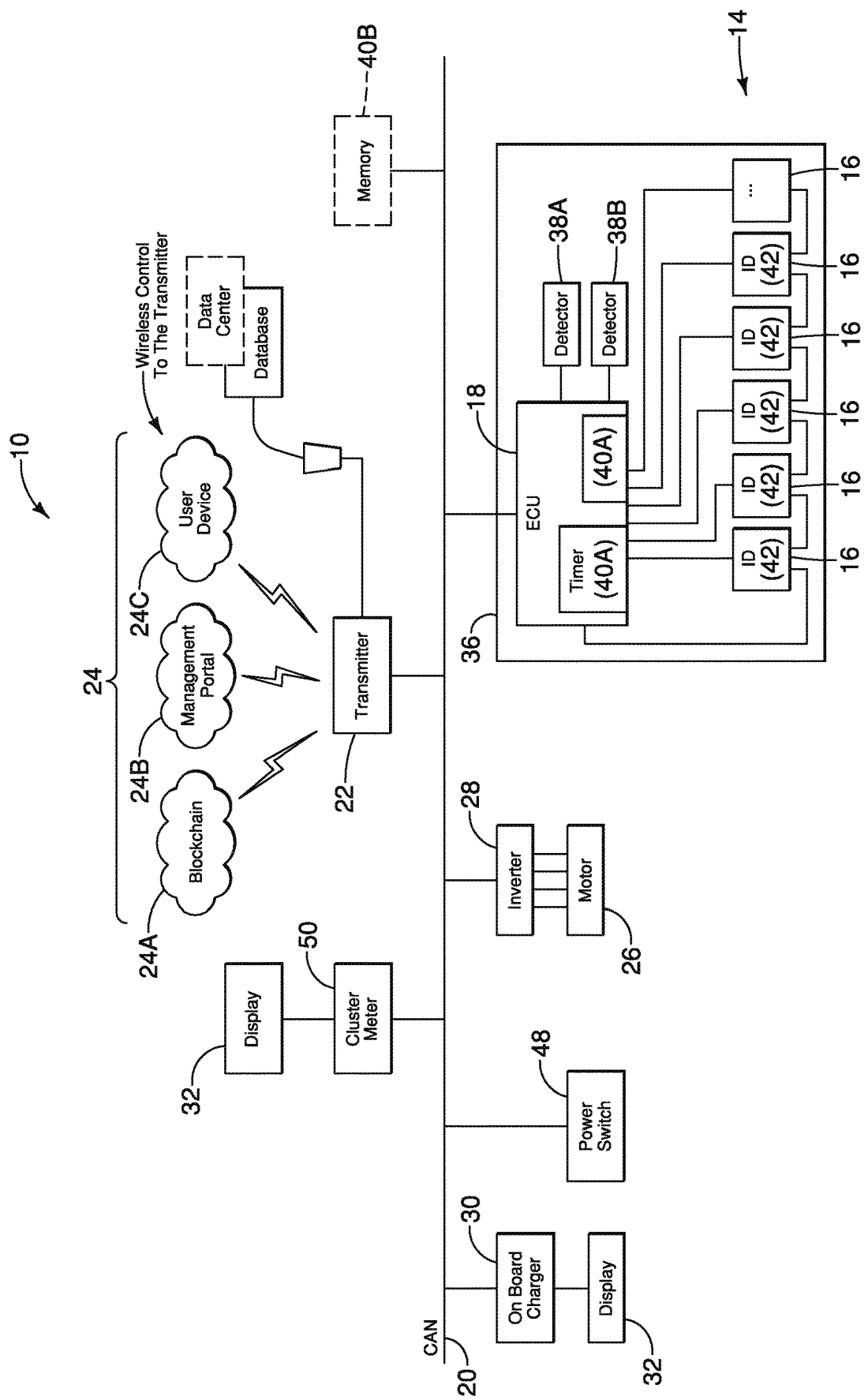
FIG. 1 is a schematic diagram of a vehicle battery life tracking system for a vehicle battery in accordance with an illustrated embodiment.

Referring initially to FIG. 1, a vehicle battery life tracking system 10 is illustrated in accordance with an illustrated embodiment. As shown, the vehicle battery life tracking system 10 is to be implemented for an electric vehicle 12 that is powered by one or more electric-vehicle batteries (EVB 14) (only one illustrated in FIG. 1). That is, the vehicle 12 is equipped with the battery life tracking system 10 for tracking the life of the EVB 14 of the vehicle 12. The EVB 14 is a secondary (rechargeable) battery that is preferably a lithium-ion battery. As shown, the EVB 14 comprises a plurality of individual battery unit 16. In the illustrated embodiment, the term "individual battery unit 16" will refer to components of the EVB 14 such as such as battery cells 16A, modules 16B and/or battery packs 16C. The EVB 14 of the illustrated embodiment is electrically connected to an electrical control unit (ECU 18) of the vehicle 12 for controlling various aspects of the battery life tracking system 10. Therefore, the battery life tracking system 10 and the vehicle 12 includes the ECU 18 for controlling the battery life tracking system 10.

As shown in FIG. 1, the vehicle 12 is preferably equipped with an in-vehicle network (CAN 20) and a wireless communication unit 22. The CAN 20 is an example of a Controller Area Network (CAN bus) that is a vehicle bus standard designed to allow microcontrollers (e.g., the ECU 18) and electronic devices (e.g., the wireless communication unit 22, the EVB 14, etc.) of the vehicle 12 to communicate with each other in applications without a host computer. The ECU 18 is in electrical communication with the CAN 20 and the wireless communication unit 22 so that information regarding the EVB 14 will be transmitted from the CAN 20 to one or more external databases (e.g., external memory storage 24), as will be further discussed below.

In the illustrated embodiment, the external memory storage 24 can include a blockchain ledger 24A, an external management portal 24B, and one or more user devices 24C (e.g., mobile devices). In other words, the blockchain ledger 24A, the external management portal 24B and the user device of FIG. 1 are examples of external memory storage 24 that can wirelessly receive information regarding the EVB 14 from the vehicle 12. It will be apparent to those skilled in the vehicle field from this disclosure that the external memory storage 24 can be other types of databases for receiving information regarding the EVB 14.

Figure 3:
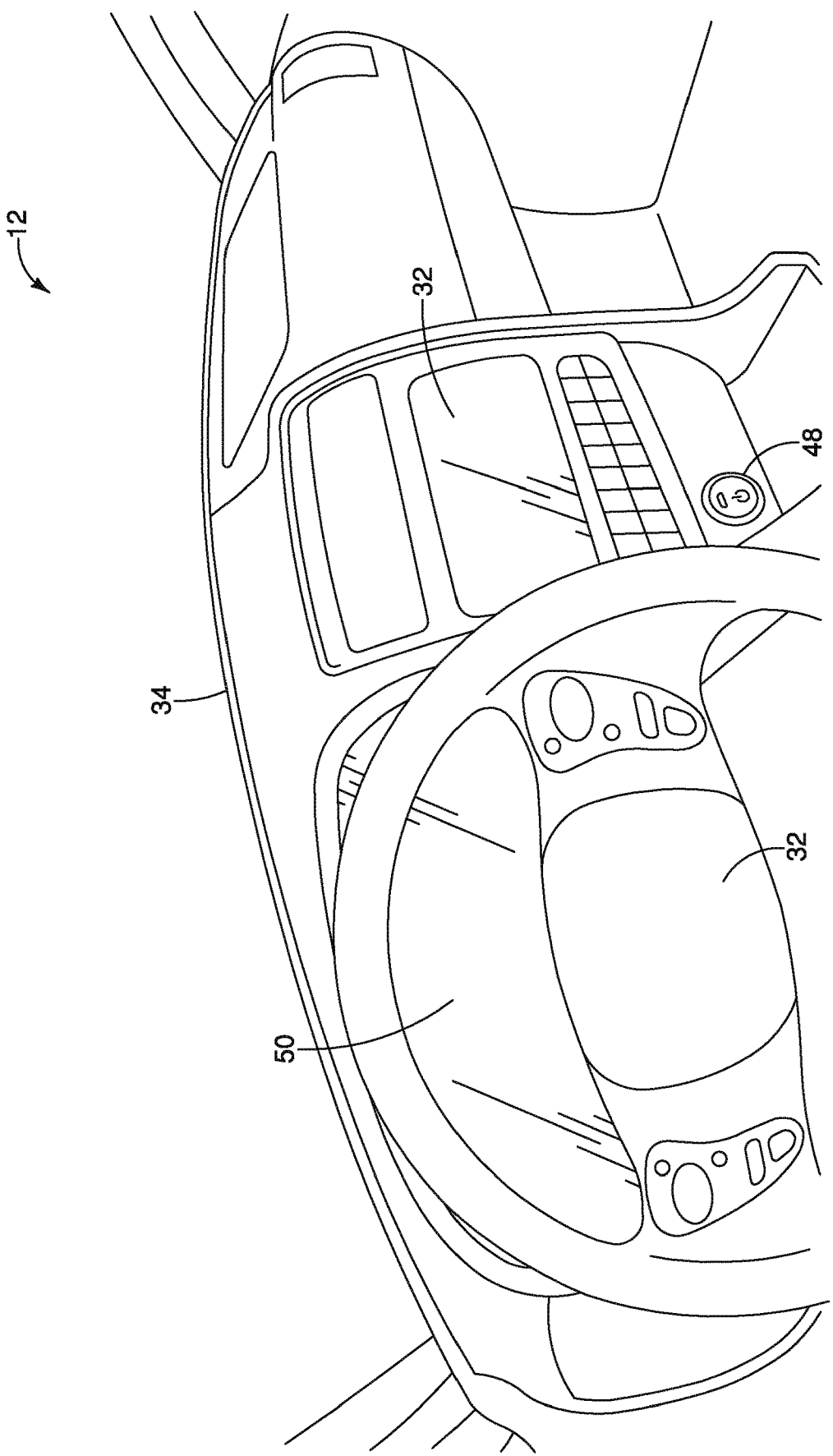
FIG. 3 is a perspective view of a dashboard having a vehicle display that can display information regarding the vehicle battery life tracking system.

In the illustrated embodiment, the vehicle battery life tracking system 10 comprises the EVB 14, the ECU 18 and the wireless communication unit 22 of the vehicle 12. The vehicle 12 comprises the EVB 14, the ECU 18 and the wireless communication unit 22. In other words, the vehicle 12 is equipped with the EVB 14, the ECU 18 and the wireless communication unit 22. The vehicle 12 is further equipped with an electric motor 26 and an inverter 28 that are in electric communication with the CAN 20 in a conventional manner. The vehicle 12 is further equipped with an on-board charger 30 for charging the EVB 14. The on-board charger 30 is in electrical communication with the CAN 20 and with a vehicle display 32 to send information regarding the chargeability and the condition of the EVB 14, as will be further discussed below. The vehicle display 32 can include one or display screens that are located on the vehicle's 12 dashboard 34, such as seen in FIG. 3. The display 32 can be configured to display 32 information relating to the vehicle's 12 components, such as the EVB 14, as will be further described below.

Figure 2:
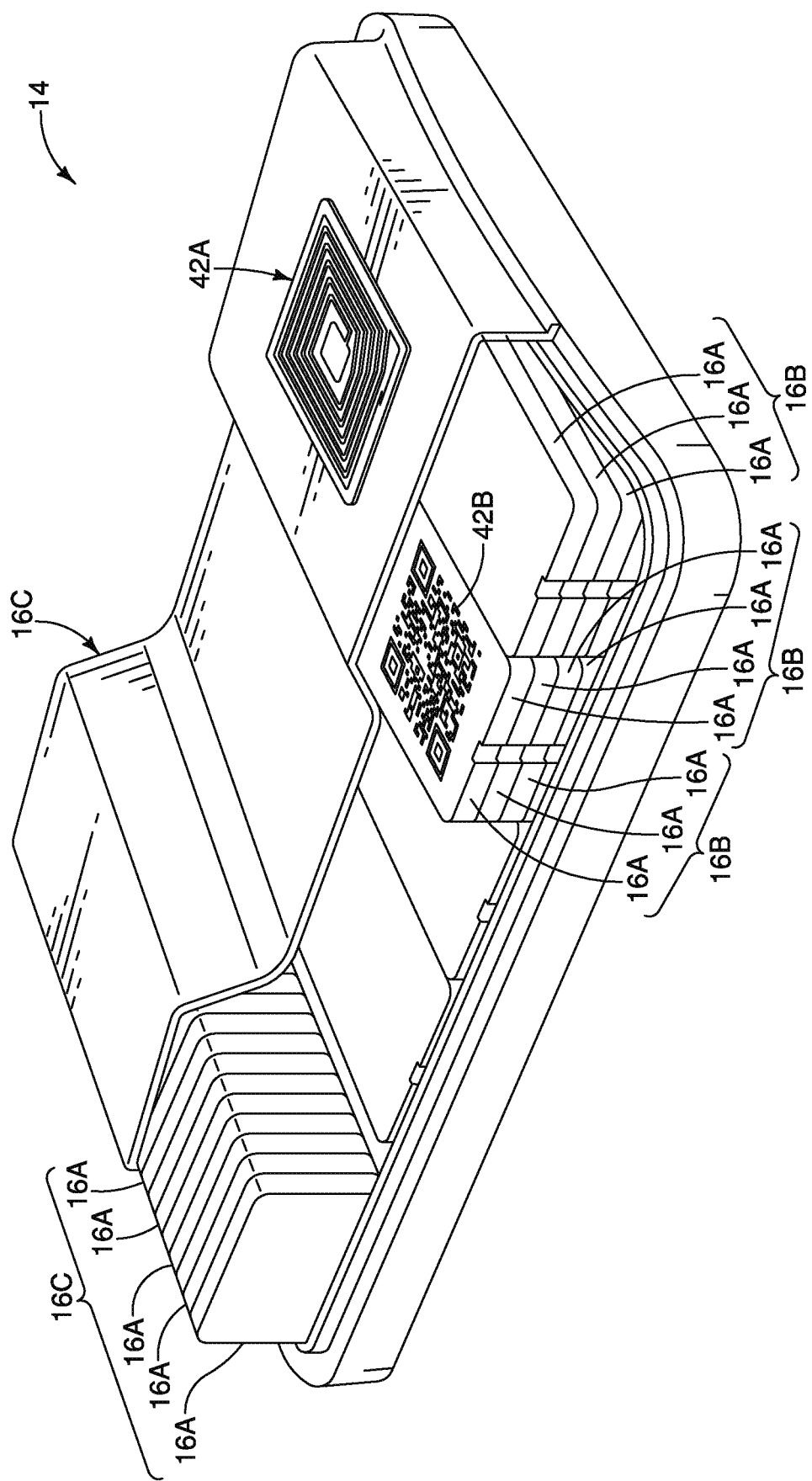
FIG. 2 is a perspective view of the vehicle battery having a plurality of individual battery units that are labeled with identification tags.

As best seen in FIGS. 1 and 2, the EVB 14 is comprised of the plurality of individual battery unit 16 that are electrically connected to the ECU 18 as part of an integrated circuit with the ECU 18. The integrated circuit can be a battery monitor circuit 36 within the EVB 14. Alternatively, the battery monitor circuit 36 can be located outside of the EVB 14, for example by being attached to the positive and negative terminals of the EVB 14 by wires (not shown).

Preferably, the vehicle 12 includes one or more detectors 38A and 38B positioned and configured to detect chargeability condition of the battery unit 16. The detectors 38A and 38B are electrically connected to the ECU 18 as part of the battery monitor circuit 36. The ECU 18 is in electrical communication with the CAN 20 to transmit chargeability information detected by the detectors 38A and 38B to the external memory storage 24 via the wireless communication unit 22, as will be further discussed below. The CAN 20 can also be electrically connected to a memory 40A or storage database of the ECU 18 or directly in communication with an on-board memory 40B. The memory 40A and 40B or storage database can store information regarding the chargeability of the EVB 14, as will be further discussed below.

In the illustrated embodiment, the individual battery unit 16 of the EVB 14 are provided with an identification tag 42, as will be described below. The detectors 38A and 38B detect chargeability information related to the individual battery unit 16, and provide the chargeability information to the ECU 18 which associates the chargeability information with the identification tags 42 of the individual battery unit 16. In other words, the ECU 18 will receive and process information regarding the chargeability information from the detectors 38A and 38B and transmit that information to the CAN 20 and the wireless communication unit 22. In this way, the chargeability information transmitted to the external memory storage 24 from the wireless communication unit 22 will be associated with the individual cell 16A, module 16B or battery pack 16C of the EVB 14, as will be further discussed below.

Referring to FIGS. 1 and 2, EVB 14 is comprised of cells 16A and battery modules 16B that make up the battery pack 16C for the EVB 14. In the illustrated embodiment, the EVB 14 is illustrated as a single battery pack 16C that is made up of modules 16B and cells 16A. However, it will be apparent to those skilled in the vehicle field from this disclosure that the vehicle 12 can include additional battery packs 16C as needed and/or desired.

The cells 16A are electrochemical cells that are the basic unit of the EVB 14. The cells 16A are assembled into one or more frames to protect the cells 16A from external shocks, such as heat or vibration. The assembled cells 16A in the frame together define the modules 16B. The modules 16B are then assembled together with a battery management system (BMS) and a cooling device for controlling and managing the modules' 16B internal temperature, voltage, etc. The assembled modules 16B form the battery pack 16C of the EVB 14.

As seen in FIGS. 1 and 2, each of the individual battery unit 16 are provided with an electronic identification tag 42. Preferably, each of the cells 16A and each of the modules 16B are provided with one or more identification tags 42. Additionally, the battery pack(s) 16C of the EVB 14 are provided with one or more identification tags 42. Therefore, the cells 16A can each be provided with a cell ID. The modules 16B can each be provided with a module ID, and the battery pack(s) 16C can be provided with a battery pack ID. For example, as best seen in FIG. 2, the modules 16B can be provided with radio-frequency identification (RFID) tags 42A and/or quick response (QR) codes 42B. The individual battery unit 16 can be equipped with RFID cards or labels 42A that can be scanned and screened by an external RFID reader. The RFID label 42A can be an adhesive embedded into the outer casing of the cell(s) 16A, module(s) 16B or the battery pack(s) 16C. For example, the outer case 44 of the EVB 14 is illustrated as being provided with an RFID tag 42A that can be scanned by dealers, recyclers, downstream buyers, etc. In the illustrated embodiment, the RFID label 42A and the QR code 42B are both examples of identification tags 42. Alternatively, bar codes can be implemented as identification tags in the illustrated embodiment. It will be apparent to those skilled in the vehicle field from this disclosure that the QR code 42B and the RFID label 42B illustrated in FIG. 2 is for illustrative purposes only and that the EVB 14 is not restricted to these types or configurations of identification tags 42.

In the illustrated embodiment as seen in FIG. 2, only one of the modules 16B of the EVB 14 is illustrated as including an identification tag 42 that is the QR code 42B. However, it will be apparent to those skilled in the vehicle field from this disclosure that the illustrated of the QR code for a single module is for illustration only. It will be apparent to those skilled in the vehicle field from this disclosure that each of the cells 16A, modules 16B and battery packs 16C can be equipped with an QR code 42B or a RFID tag 42A as needed and/or desired.

As shown in FIG. 1, the vehicle 12 includes the detectors 38A and 38B. In particular, the vehicle 12 includes at least one voltage detector 38B for detecting the voltage of the individual battery unit 16. The vehicle 12 further includes at least one temperature detector 38A for detecting the temperature of the individual battery unit 16. The term "detector" as used in this disclosure refers to a hardware device or instrument designed to detect the presence of a particular object or substance and to emit a signal in response. The term "detector" as used herein do not include a human.

The voltage detector 38B can be an isolation voltage detector configured to monitor the isolation resistance of the voltages within the individual battery unit 16. However, it will be apparent to those skilled in the vehicle field from this disclosure that any suitable device for sensing the voltage of the EVB 14 can be implemented with the vehicle 12 and the battery life tracking system 10 of the illustrated embodiment. The voltage detector 38B can be electrically connected by a wires to positive and negative terminals of the EVB 14 in order to sense the voltage between the positive and negative terminals. In the illustrated embodiment, the voltage detector 38B is electrically connected to the ECU 18 and is provided with the individual battery unit 16 and the ECU 18 as part of the battery monitor circuit 36. As shown, the voltage detector 38B is embedded with the battery monitor circuit 36. Therefore, the voltage detector 38B can be configured to sense voltage of one of the terminals of a series of cells 16A or a series of modules 16B of the EVB 14. Alternatively, the voltage detector 38B may be configured to measure the temperature at a location or space between two or more cells 16A or two or two or more modules 16B connected in series or the like. In this way, the chargeability information detected by the voltage detector 38B can be associated with the individual battery unit 16.

The temperature detector 38A is configured to sense a temperature measurement of the individual battery unit 16 of the EVB 14. The temperature detector 38A is preferably configured to sense a temperature measurement at a location in or inside of the EVB 14. The temperature detector 38A can be a thermocouple, a thermistor, a temperature sensing integrated circuit, and/or the like. In the illustrated embodiment, the temperature detector 38A is embedded with the battery monitor circuit 36. The temperature detector 38A can be connected to the positive or negative terminals of the EVB 14. Therefore, the temperature detector 38A can be configured to sense a temperature of one of the terminals of a series of cells 16A or a series of modules 16B of the EVB 14. Alternatively, the temperature detector 38A can be configured to measure the temperature at a location or space between two or more cells 16A or two or two or more modules 16B connected in series or the like. In this manner, the temperature detected by the battery monitor circuit 36 can be representative of the temperature of the cells 16A and the modules 16B comprising the EVB 14. Alternatively, temperature detector 38A can also be located on and/or directly coupled to the printed circuit board of the battery monitor circuit 36.

While the vehicle 12 and the battery life tracking system 10 of the illustrated embodiment are illustrated as including a single temperature detector 38A and a single voltage detector 38B, it will be apparent to those skilled in the vehicle field that the detectors 38A and 38B are shown for illustrative purposes only and that the vehicle 12 and the battery life tracking system 10 can include multiple temperature detectors 38A and 38B and voltage detector 38Bs 38A and 38B at various locations in and around the EVB 14 as necessary. Further, it will be apparent to those skilled in the vehicle field from this disclosure that the vehicle 12 and the battery life tracking system 10 can be further equipped with detectors 38A and 38B for sensing additional chargeability information, such as humidity, accelerometer and shock of the EVB 14.

In the illustrated embodiment, the battery monitor circuit 36 preferably comprises a printed circuit board for supporting and electrically coupling the voltage detector 38B, the temperature detector 38A and the ECU 18. Moreover, any suitable attachment device or method can be used to keep the battery monitor circuit 36 in a desired position and/or orientation on, near, and/or within the EVB 14. Preferably, the battery monitor circuit 36 is located within a housing of the EVB 14. For example, the battery monitor circuit 36 is located within or between a series of cells 16A or series of modules 16B of the EVB 14 to monitor the chargeability information of the cells 16A or modules 16B. However, it will be apparent to those skilled in the vehicle field from this disclosure that the battery monitor circuit 36 can be located external to the EVB 14 if desired and/or necessary.

The ECU 18 is preferably a microcomputer or central processing unit (CPU) that includes at least one processor and at least one computer storage device (i.e., computer memory 40A devices). The electronic controller is formed of one or more semiconductor chips that are mounted on a printed circuit board. The ECU 18 can be one or more integrated circuits having firmware for causing the circuitry to complete the activities described herein. Of course, any number of other analog and/or digital components capable of performing the below described functionality can be provided in place of, or in conjunction with the below described electronic controller. The term "electronic controller" and "ECU" as used herein refers to hardware that executes a software program, and does not include a human.

By receiving information from the detectors 38A and 38B, the ECU 18 is programmed to monitor and store chargeability information associated with the individual battery unit 16. In the illustrated embodiment, the chargeability information includes temperature information of the plurality of individual battery unit 16 based on information received by the temperature detector 38A. The chargeability information includes internal resistance condition of the plurality of individual battery unit 16 based on information received by the voltage detector 38B. The detectors 38A and 38B are configured and located to detect chargeability information related to the individual battery unit 16, such as the cells 16A and the modules 16B. Therefore, the chargeability information received by the ECU 18 and transmitted by the wireless communication unit 22 includes chargeability history of the plurality of individual battery unit 16.

The ECU 18 is programmed to control the wireless communication unit 22 to upload the chargeability information to the external memory storage 24 upon the occurrence of one or more predetermined incidents. For example, the ECU 18 can be programmed to upload the chargeability information every time the vehicle 12 is turned ON. The ECU 18 can be programmed to upload the chargeability information every time the vehicle 12 receives a charge via the on-board charger 30. The ECU 18 can additionally be programmed to upload the chargeability information every time the identification tags 42 are scanned by an external scanner. For example, if and when the vehicle 12 is serviced, sold, or if the EVB 14 is to be serviced or sold, sold, the identification tags 42 can be scanned. The event of the scan will cause the ECU 18 to command the wireless communication unit 22 to upload chargeability information regarding the EVB 14. In particular, when the vehicle 12 is sold, the EVB 14 will likely be removed to be tested in order to determine its residual capacity. At this point, the identification tags 42 will be scanned for a recycler or dealer to determine whether the EVB 14 can be recycled, or whether any of the cells 16A or the modules 16B of the EVB 14 can be serviced or replaced. Once the identification tags 42 are scanned, the chargeability information is uploaded to the external memory storage 24, which can be accessed by the recycler and/or dealer.

Thus, in the illustrated embodiment, the predetermined incidents include turning the vehicle 12 ON, charging the EVB 14 and scanning any one of the electronic identification tags 42. It will be apparent to those skilled in the vehicle field from this disclosure that the ECU 18 can be programmed to upload chargeability information upon additional and alternatively predetermined incidents as needed and/or necessary. For example, the ECU 18 can be programmed to upload chargeability information on a periodic basis (e.g., once a day, once a week, once a month, etc.). The ECU 18 can also be programmed to upload chargeability information at other specific incidents, such as being based on the mileage of the vehicle 12 or running time of the vehicle 12.

At the same time, the detectors 38A and 38B can be programmed to automatically detect the chargeability information of the battery unit 16 of the EVB 14 at a regular periodic basis (e.g., once a day, once a week, once a month, etc.). The detectors 38A and 38B can also regularly detect the chargeability information to be in accordance with the upload frequency by the ECU 18 to the wireless communication unit 22. Therefore, the ECU 18 can command the detectors 38A and 38B to detect the chargeability information each time the vehicle 12 turns ON, at each instance the EVB 14 is being charged or when any of the identification tags 42 of the EVB 14 has been scanned, etc. In addition to the chargeability information, the ECU 18 can additionally be programmed to upload charging history of the EVB 14, maintenance record(s) and histories regarding the EVB 14, etc.

The ECU 18 is programmed to provide a time stamp associated with each upload. A timer 46 is preferably mounted to the printed circuit board that the ECU 18 is mounted to. The timer 46 is capable of maintaining time referenced to a standard time such as Universal Time Coordinated (UTC), independent of any connection (wired or wireless) to an external time standard such as a time signal accessible via a public network such as the Internet. The timer 46 is configured to provide the current time/date (or a relative time) to the ECU 18. The ECU 18 is programmed to transmit the time, the chargeability information (e.g., the temperature and voltage data) by providing the data in a signal to wireless communication unit 22.

Alternatively, instead of the timer 46, the ECU 18 can be programmed to sample the chargeability information at consistent time intervals. The ECU 18 can be programmed to number and catalogue each interval of receiving chargeability information sequentially with a sequence number to uniquely identify the chargeability information with the associated time it was detected. The ECU 18 can be programmed to catalogue all sampled chargeability information. Alternatively, the ECU 18 can be programmed to upload data after having determined that a new set of chargeability information acquired by the detectors 38A and 38B has changed from the chargeability information acquired in a previous cycle(s) by a predetermined amount or more. The ECU 18 can be configured to transmit the cumulative time and chargeability information by providing the data in a signal to the wireless communication unit 22.

The ECU 18 includes memory 40A for storing the chargeability information associated with the plurality of individual battery unit 16. The memory 40A is any computer storage device or any non-transitory computer-readable medium with the sole exception of a transitory, propagating signal. For example, the memory 40A can include nonvolatile memory 40A and volatile memory 40A, and can includes a ROM (Read Only Memory 40A) device, a RAM (Random Access Memory 40A) device, a hard disk, a flash drive, etc. The memory 40A or computer storage device is configured to store settings, programs, data, calculations and/or results of the processor(s) of the ECU 18.

The ECU 18 is programmed to receive the chargeability information (e.g., voltage and temperature information) from the detectors 38A and 38B, and is programmed to store the chargeability information in the memory 40A. The chargeability information can be provided with time stamps, or be associated with a time that the data was acquired, detected and/or stored in the memory 40A. The chargeability information and the time data can be stored in the memory 40A in the form of a database, a flat file, a blob of binary, or any other suitable format or structure. In the illustrated embodiment, the vehicle 12 can be equipped with memory 40A for the battery life tracking system 10 as part of the ECU's 18 processor. Alternatively, the vehicle 12 can be equipped with memory 40A or computer storage device for the battery life tracking system 10 that is separate from the ECU 18 but in communication with the CAN, as shown in FIG. 1.

The inverter 28 for the vehicle 12 is preferably a variable-frequency drive (VFD), adjustable-frequency drive (AFD), variable-voltage/variable frequency (VVVF) drive, variable speed drive (VSD), AC drive, micro drive or inverter drive. The inverter 28 is a type of adjustable-speed drive used in electro-mechanical drive systems to control AC motor speed and torque by varying motor 26 input frequency and voltage. In the illustrated embodiment, the inverter 28 is in communication with the battery monitor circuit 36 via the CAN 20. The vehicle 12 is further equipped with the on-board charger 30 for charging the vehicle 12. The on-board charger 30 takes AC power from an external source, such as private or public charging stations. The on-board charger 30 converts that charge into DC power to be stored in the EVB 14. The on-board charger 30 provides the means to recharge the EVB 14.

In the illustrated embodiment, the ECU 18 is programmed to send a termination signal to the on-board charger 30 to terminate charging of the EVB 14 upon determining that the chargeability of any of the individual battery units 16 is below a threshold level. For example, if the ECU 18 determines that a certain level of degradation in the EVB 14 has been reached, such as if the ECU 18 determines that the EVB 14 cannot achieve 100% of charge from the on-board charger 30. That is, the ECU 18 can be programmed to send a termination signal to the on-board charger 30 to cease charging or to only charge the EVB 14 to a predetermined level (e.g., not 100% charge) in the event that a predetermined level of degradation has been detected. For example, the ECU 18 can be programmed to calculate the EVB's 14 residual value at each instance that the detectors 38A and 38B undergo a detection cycle for chargeability information. The ECU 18 can additionally be programmed to predict the EVB 14's residual value based on information received by the detectors 38A and 38B during each detection cycle. Therefore, the ECU 18 can send the termination signal (e.g., a command signal) to the on-board charger 30 to only charge the EVB 14 to a specified percentage, or to terminate charging altogether.

As seen in FIG. 1, the on-board charger 30 is electrically connected to the vehicle's 12 display 32. Referring to FIG. 3, the dashboard 34 supports the display 32, and also supports a power switch 48 for the vehicle 12. The power switch 48 can be an EV power button that turns the vehicle 12 ON and OFF. The dashboard 34 also supports an electronic instrument cluster 50 (e.g., a cluster meter, a digital instrument panel or a digital dash) that is a set of instrumentation, including a speedometer and a odometer for the vehicle 12. The instrument cluster 50 is electrically connected to the CAN 20 to receive and send information to other components of the vehicle 12 and the battery life tracking system 10 via the CAN 20, as shown in FIG. 1.

Figure 6:
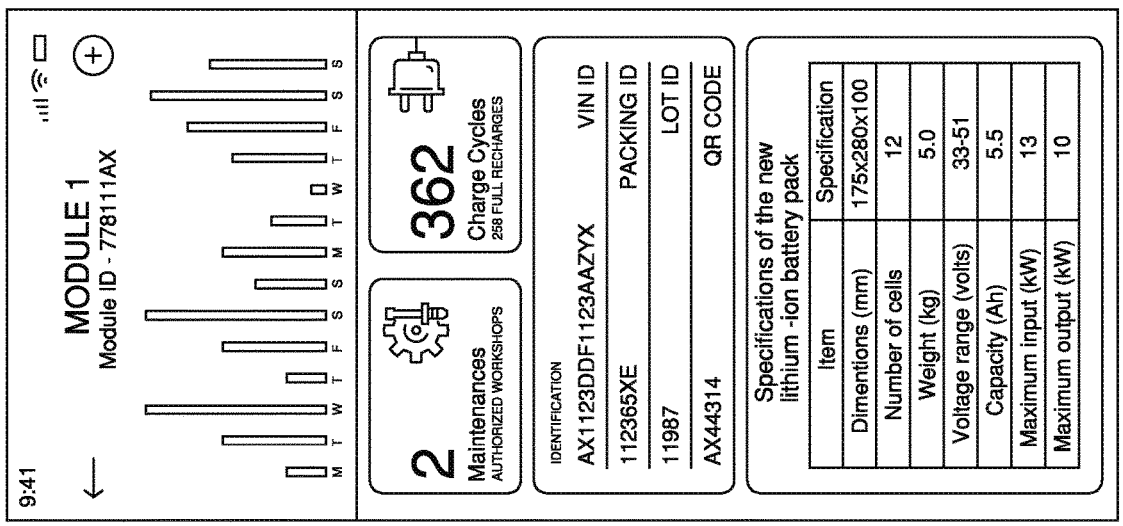
FIG. 6 is a sample screenshot of chargeability information regarding the vehicle battery that can be displayed on the display.
Figure 5:
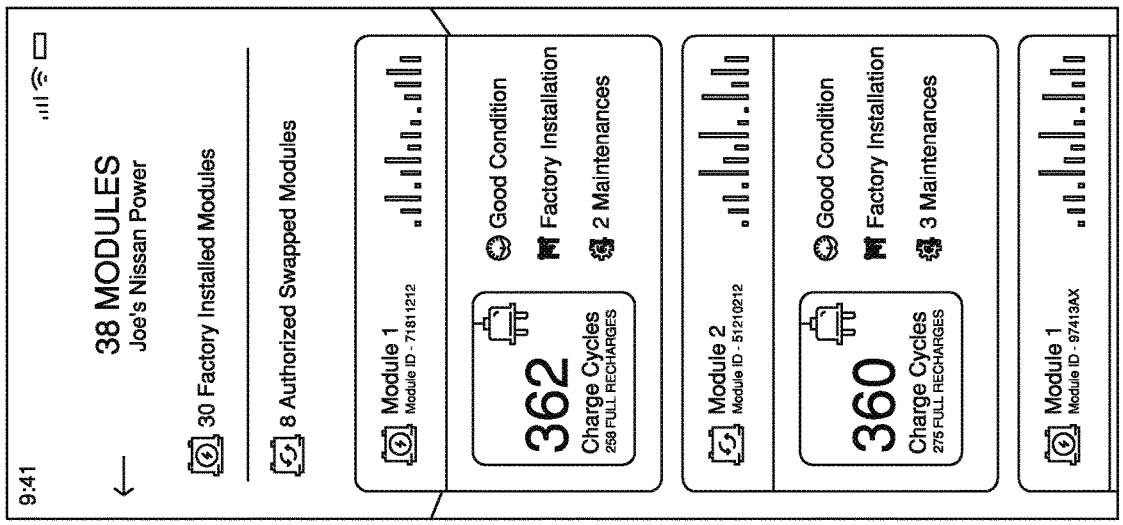
FIG. 5 is a sample screenshot of chargeability information regarding the vehicle battery that can be displayed on the display.
Figure 4:
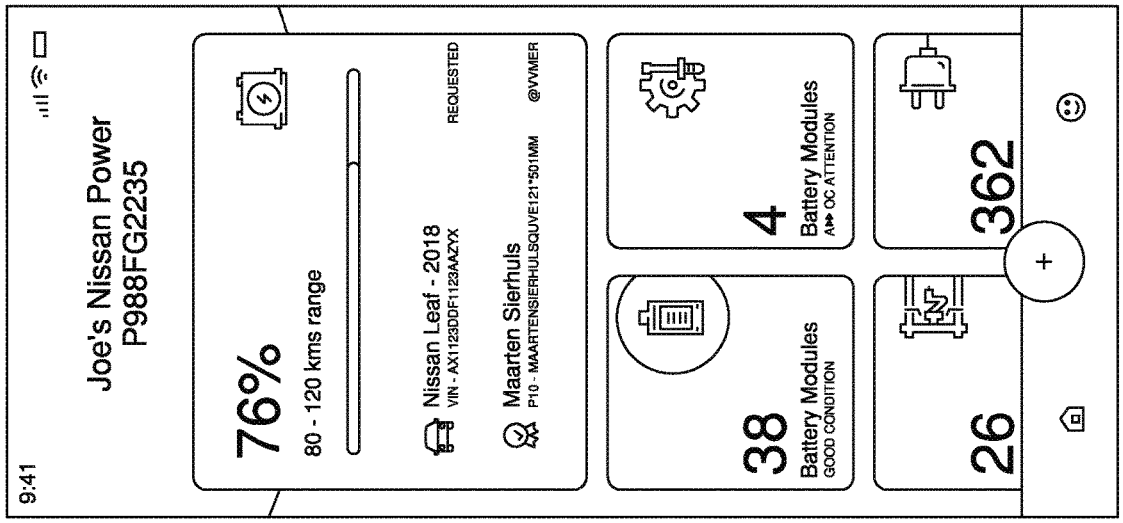
FIG. 4 is a sample screenshot of chargeability information regarding the vehicle battery that can be displayed on the display.
Figure 7:
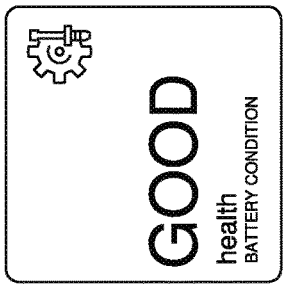
FIG. 7 is a sample screenshot of chargeability information regarding the vehicle battery that can be displayed on the display.
Figure 9:
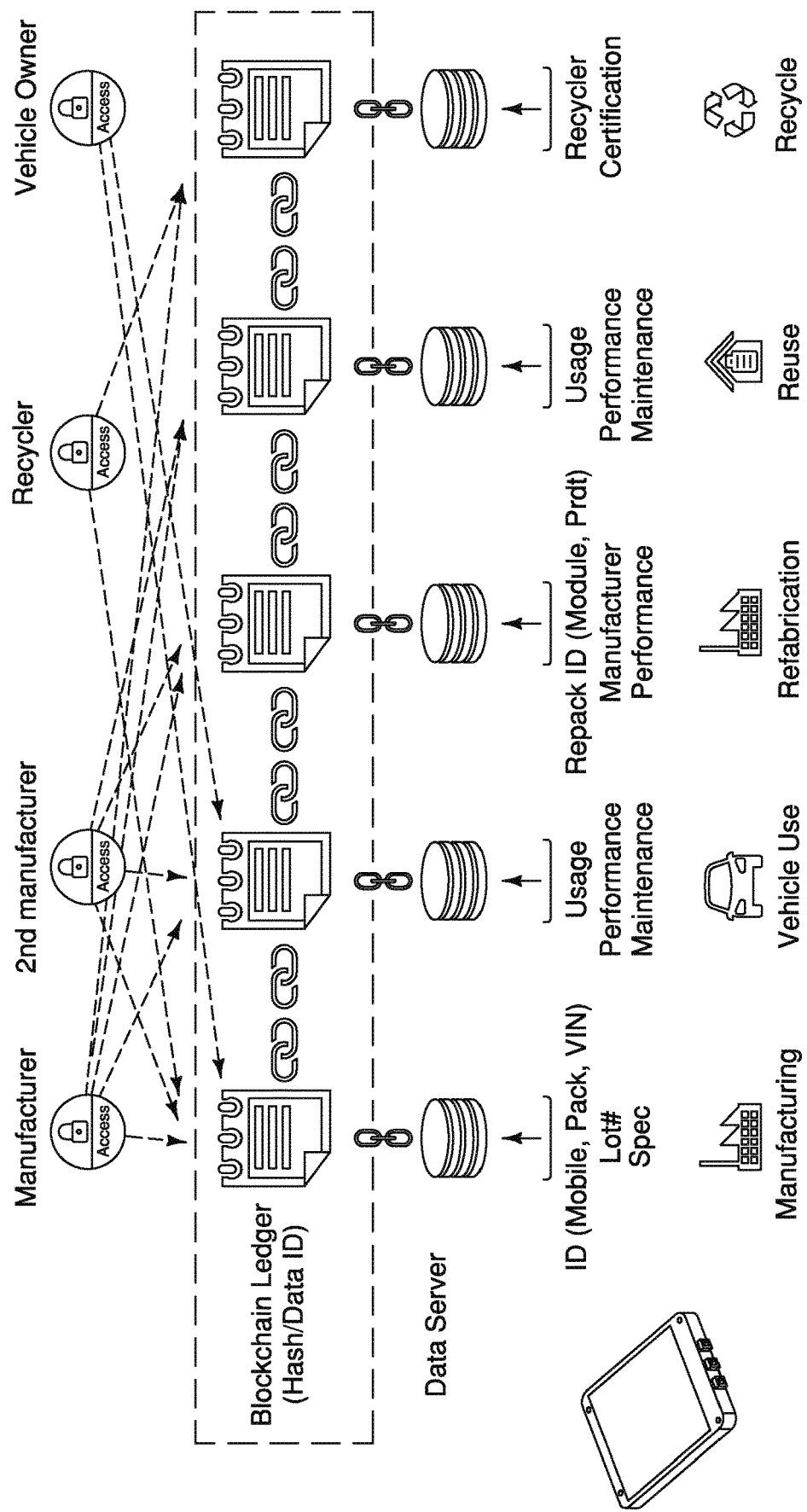
FIG. 9 is a schematic diagram of a blockchain ledger that can store and transmit chargeability information relating to the vehicle battery.
Figure 10:
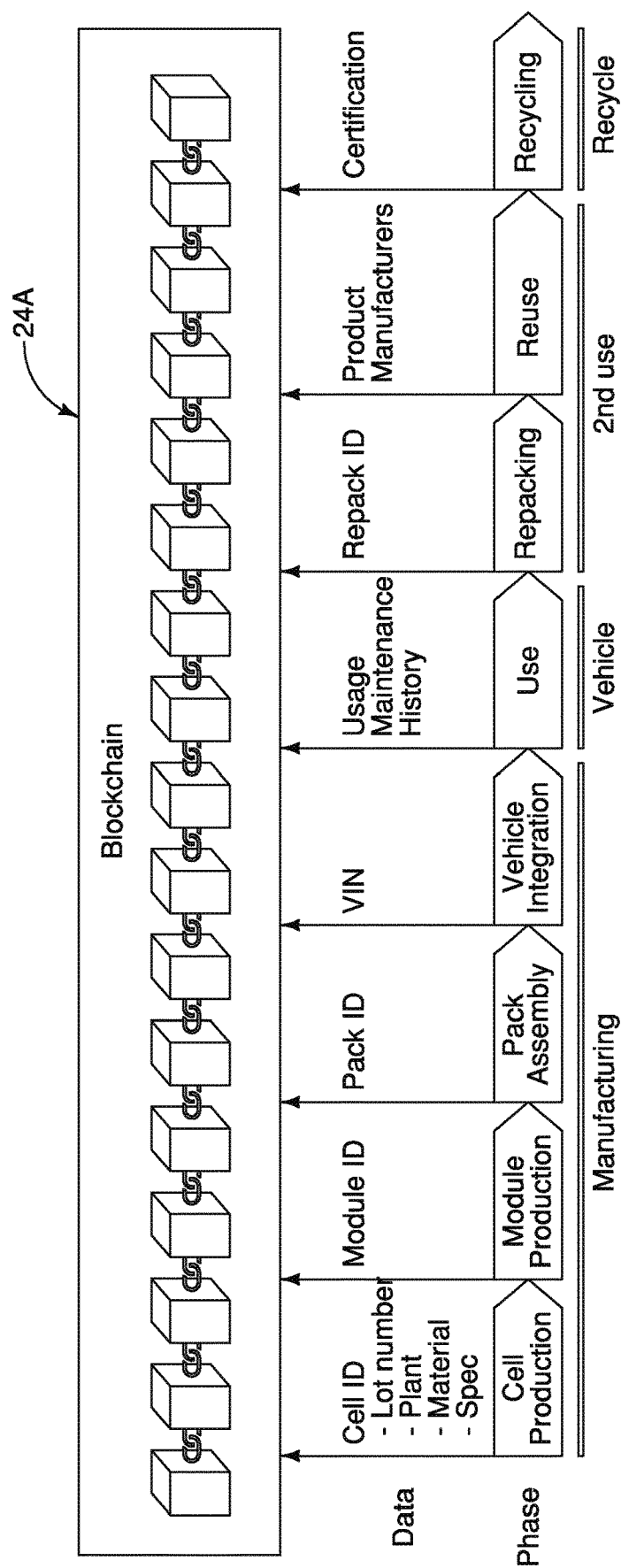
FIG. 10 is a schematic diagram of a blockchain ledger that can store and transmit chargeability information relating to the vehicle battery.

The display 32 can be in communication with the ECU 18 to display data processed by the ECU 18 and chargeability information detected by the detectors 38A and 38B. For example, as seen in FIGS. 4 to 7, the display 32 can display an overall condition of the EVB 14 and driving history (such as seen in FIG. 4). Alternatively, the display 32 can display information specific to the individual battery unit 16 of the EVB 14, such as information specific to modules 16B, as seen in FIGS. 5 and 6. The display 32 can also display charging history with respect to the EVB 14, as seen in FIG. 7. Therefore, the display 32 can display data as a number of recharge cycles, detected voltage, detected temperature and other detector data, percentage of total battery discharge, and other relevant data. For example, as seen in FIGS. 9 and 10, other relevant data can include identification tags 42 for the EVB 14, usage performance and maintenance records of the vehicle 12 and the EVB 14, any updated identification tags 42 acquired during repackaging or repurposing of the EVB 14, further usage information regarding the EVB 14, etc. The display 32 can include user operated inputs (e.g., buttons, switches) or the display 32 can have a touchscreen to enable the driver/user to select different types of information regarding the EVB 14 to be displayed on the display 32.

In the illustrated embodiment, the ECU 18 is programmed to send a notification alert to the display 32 upon determining that the chargeability of any of the individual battery unit 16 is below a threshold level. That is, the display 32 can display an alert to the driver that any of the cells 16A or modules 16B of EVB 14 is degraded and that 100% charge of the EVB 14 cannot be reached. The threshold level can be any level desired in order for the display 32 to display the alert in order to inform the driver that any of the cells 16A or modules 16B of the EVB 14 may need replacement or that the EVB 14 needs servicing or repurposing.

The wireless communication unit 22 is provided with the vehicle 12 and is configured to upload the chargeability information to the external memory storage 24 upon the occurrence of pre-determined incidents. The wireless communication unit 22 can be a telematics control unit that controls wireless tracking. The term "wireless communication unit" as used herein includes a receiver, a transmitter, a transceiver, a transmitter-receiver, and contemplates any device or devices, separate or combined, capable of transmitting and/or receiving wireless communication signals, including shift signals or control, command or other signals related to some function of the component being controlled. The wireless communication signals can be radio frequency (RF) signals, ultra-wide band communication signals, Bluetooth® communications, cellular radio communication standard (2G, 3G, 4G LTE, 5G, etc.), and/or the like, Wi-Fi or any other type of signal suitable for short range wireless communications as understood in the vehicle field.

The wireless communication unit 22 transmits the chargeability data and other relevant data (e.g., maintenance history of the EVB 14, charging history EVB 14, etc.) to the external memory storage 24. The external memory storage 24 is the blockchain ledger 24A, as seen in FIG. 1. Additionally, the external memory storage 24 can be an external management portal 24B for vehicle batteries, or the user device 24C. That is, the wireless communication unit 22 can upload chargeability data and relevant data to a user's mobile device to access information regarding the EVB 14. For the purposes of brevity, only the blockchain ledger 24A will be further discussed herein.

Figure 11:
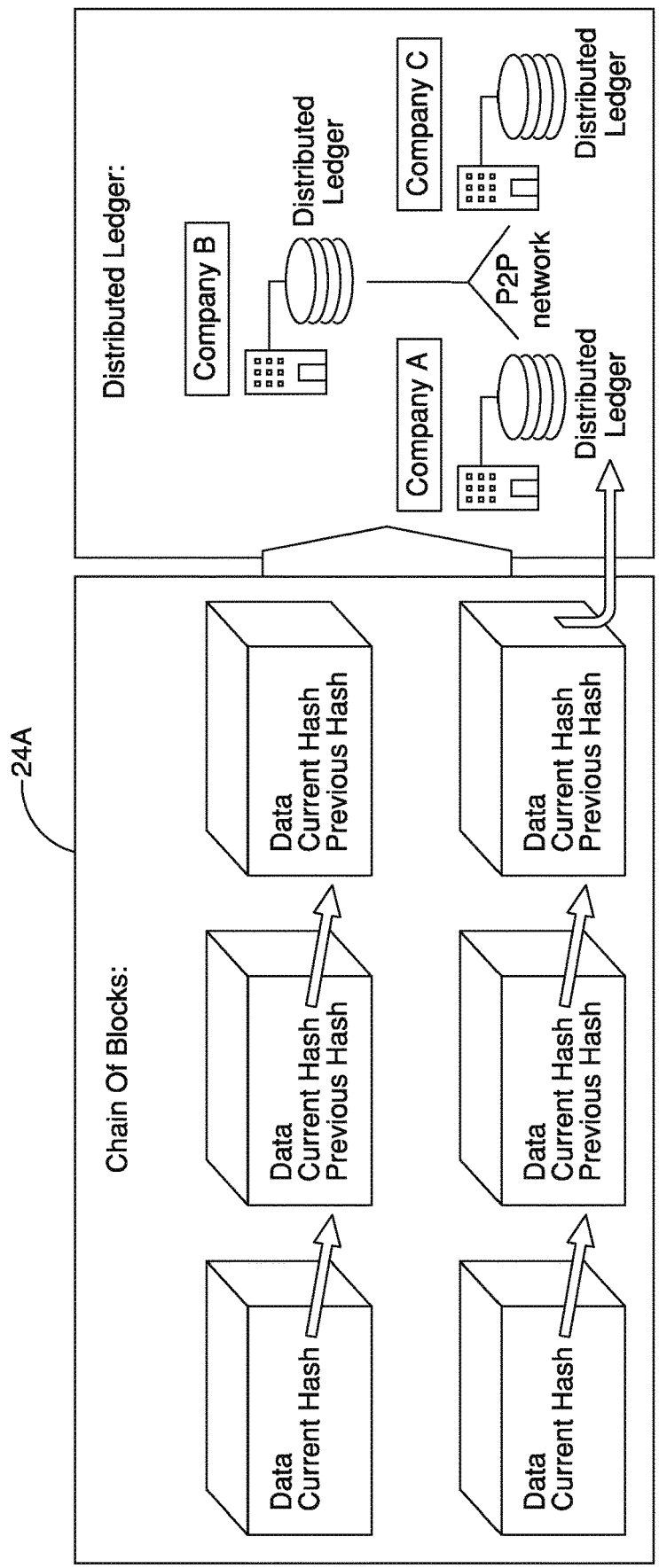
FIG. 11 a schematic diagram of a blockchain ledger that can store and transmit chargeability information relating to the vehicle battery.

The blockchain ledger 24A is a distributed and shared ledger that enables the decentralized processing and storage of transactions via shared by a network of nodes and is continuously updated. Preferably, the blockchain ledger 24A is an off-chain storage medium. Therefore, the ECU 18 commands the wireless communication unit 22 to upload the chargeability information and other relevant data to the blockchain ledger 24A that is an off-chain ledger. In this way, the off-chain blockchain ledger 24A will maintain the most secure information as any manipulation or tampering of the data on the blockchain 24A will cause the current hash of the blockchain ledger 24A to be updated and passed over to the following blocks as a different branch on the network of information on the blockchain 24A, for example as seen in FIG. 11. Therefore, the off-chain blockchain ledger 24A will ensure transparency and accuracy of information that is uploaded. As a result, the blockchain 24A will generate a distributed ledger to various entities (such as Companies A, B and C illustrated in FIG. 11) that will have access to the information on the blockchain 24A.

Figure 8:
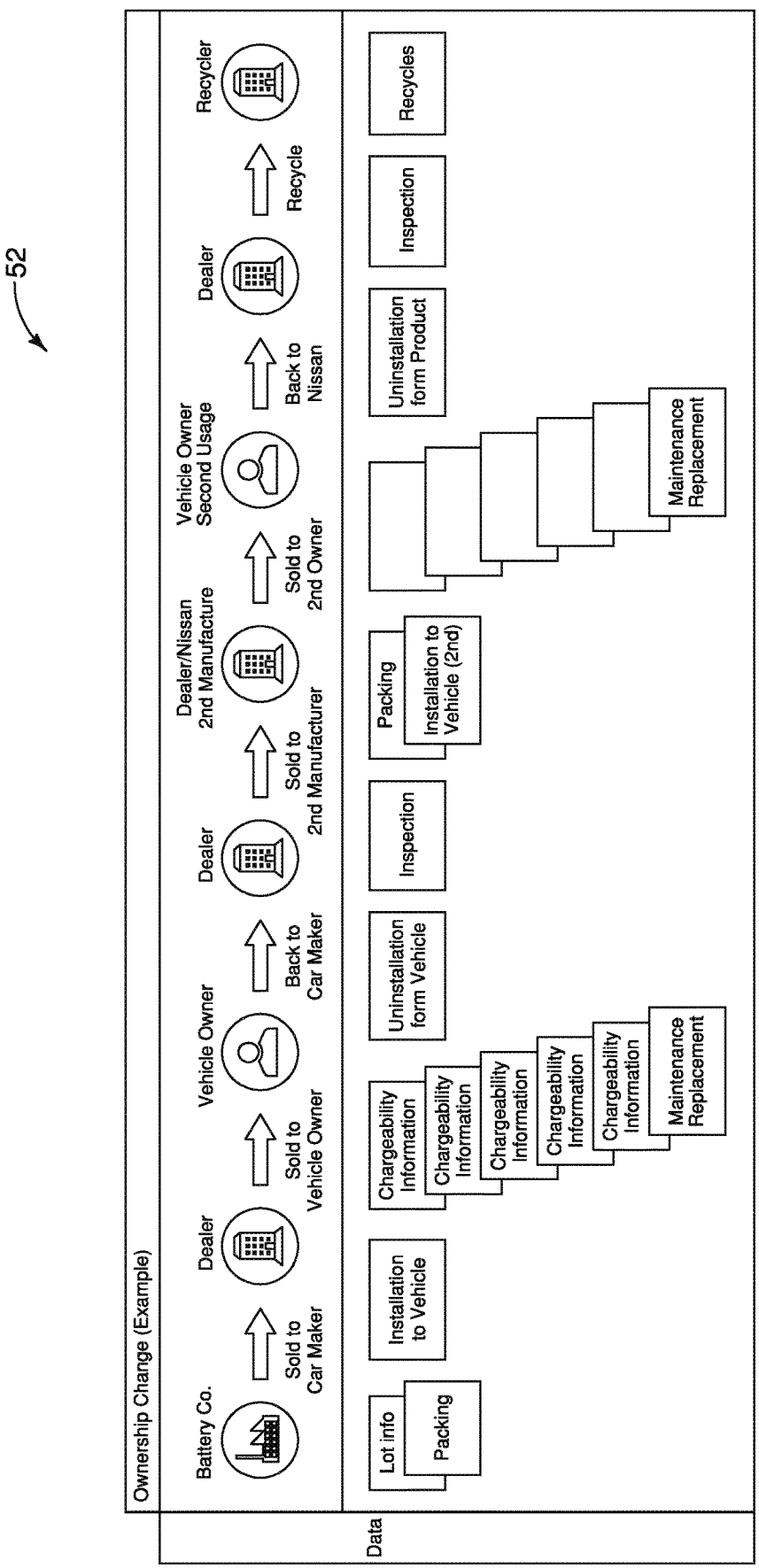
FIG. 8 is a schematic diagram of a sample ownership chain for the vehicle battery.

By uploading the chargeability information to the blockchain ledger 24A, battery recyclers, car dealers and possible downstream buyers will have access to the information and can utilize the best methods and process for recycling. Therefore, each party to an ownership chain 52 of the EVB 14 will have access to the uploaded information regarding the EVB 14, as seen in FIG. 8. That is, FIG. 8 illustrates a sample ownership chain 52 of the EVB 14 as the EVB 14 is first manufactured by the original battery company (Battery Co. in FIG. 8) and passes through dealers, various vehicle owners, to secondary manufacturers, etc. As shown, each party in the ownership chain 52 can have access to the uploaded information regarding the EVB 14 that was uploaded throughout the life of the EVB 14.

If the chargeability data on the blockchain 24A indicates that the degradation within the EVB 14 is specific to some cells 16A and modules 16B of the EVB 14, owners, dealers, potential buyers, recyclers can determine that there is no need to replace the entire EVB 14 but rather just the selected cells 16A and/or modules 16B. This replacement of individual battery unit 16 of the EVB 14 rather than the entire EVB 14 can lead to huge cost savings. Further, the battery life tracking system 10 can be implemented such that detecting of chargeability information and uploading of the chargeability information and other relevant data begins from the manufacturing stage of the vehicle 12, through the sale, resale and recycling. Therefore, the uploaded chargeability information of the EVB 14 will be a thorough history of the life of the EVB 14.

Figure 12:
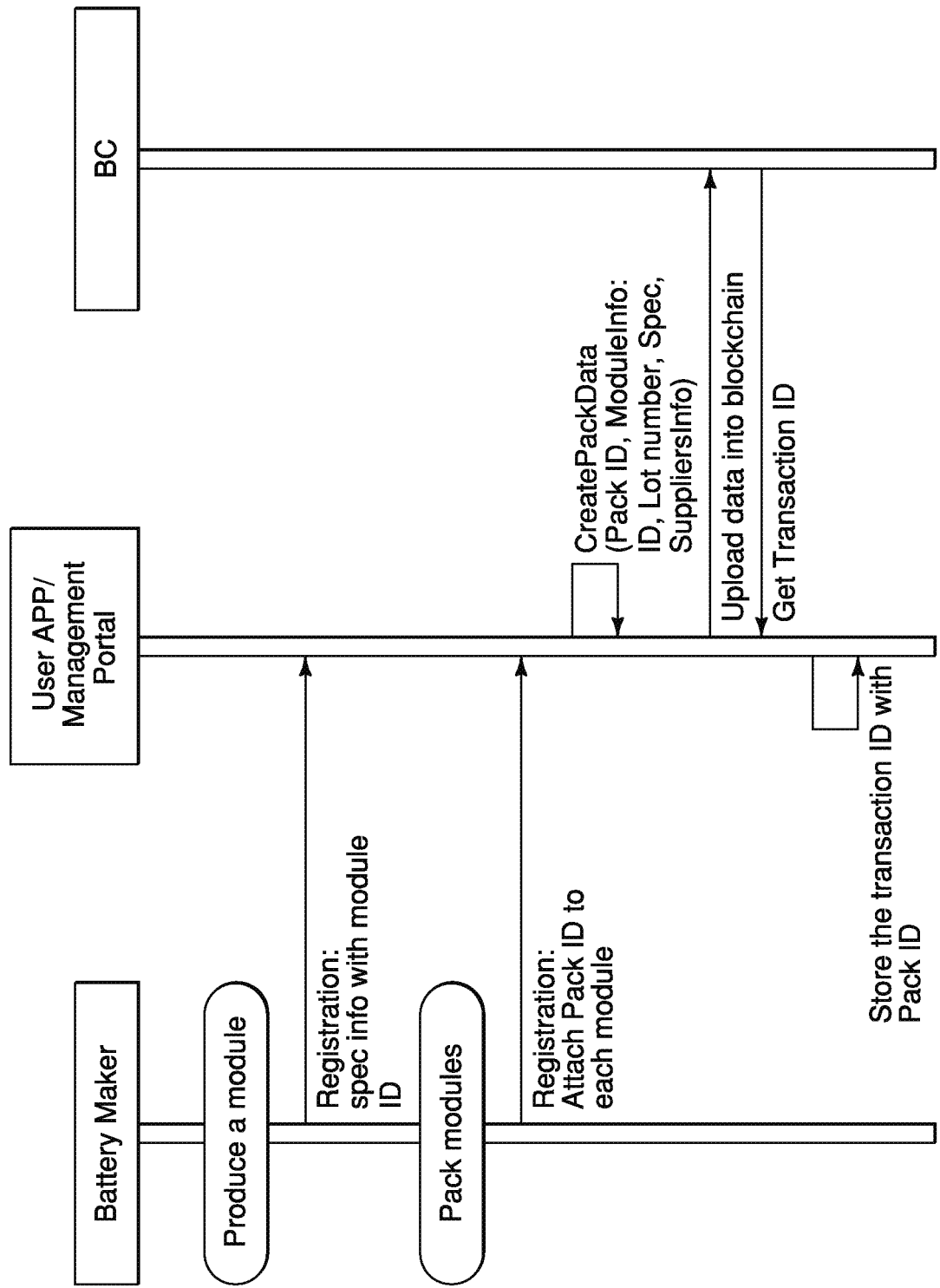
FIG. 12 is a flowchart illustrating an example of a first scenario in which chargeability information is uploaded to an external database.

Referring now to FIGS. 12 to 19, various examples of different types of scenarios in which chargeability information is uploaded to the external memory storage 24 (e.g., the blockchain ledger 24A, or "BC" as shown in FIGS. 12 to 19) will now be described. FIG. 12 illustrates an example in which a battery maker transmits chargeability information regarding the EVB 14 as the battery maker makes the individual battery units 16b (e.g., the module 16B). Chargeability information can be transmitted during the production of the modules 16B or during packing of the modules 16B. As shown, the chargeability information is transmitted to a management portal (such as a user app) and then transmitted to the blockchain BC. That is, the battery maker can have access to a user app that enables the battery maker to upload the chargeability information to the blockchain BC via the user app. FIG. 12 also illustrates examples of the types of information that can be transmitted as chargeability information, such as identification information relating to the modules 16B, etc. It will be apparent to those skilled in the vehicle field from this disclosure that the chargeability information illustrated in FIG. 12 are examples only and that additional types of chargeability information can be transmitted to the blockchain BC at additional stages with the battery maker.

Figure 13:
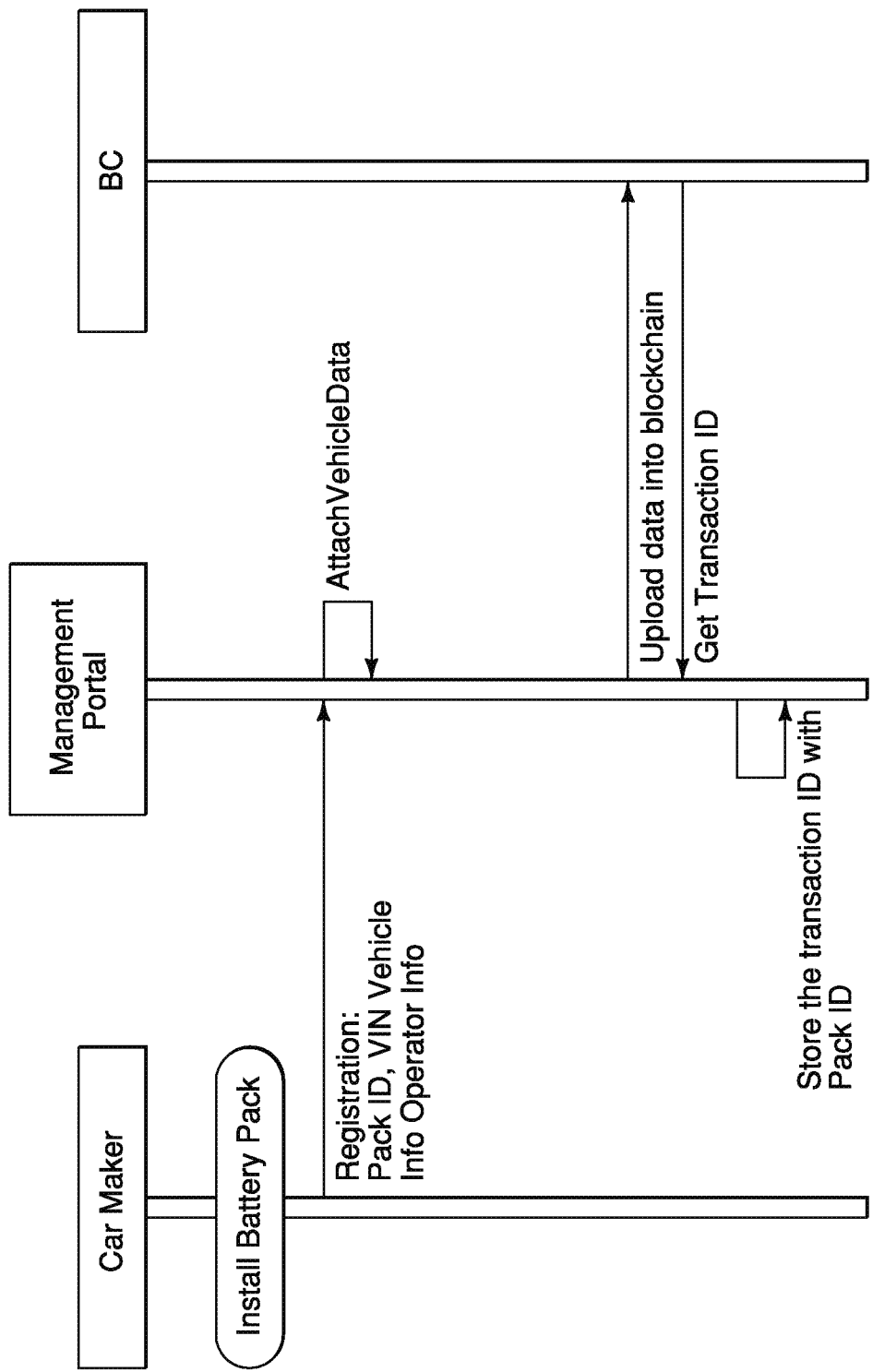
FIG. 13 is a flowchart illustrating an example of a second scenario in which chargeability information is uploaded to the external database.

FIG. 13 illustrates an example in which the maker of the vehicle 12 uploads chargeability information to the external memory storage 24, such as the blockchain BC. Similar to the scenario in FIG. 12, the chargeability information can be uploaded via a management portal, such as a user app. In this scenario, the maker of the vehicle 12 can upload chargeability information during installation of the EVB 14. It will be apparent to those skilled in the vehicle field from this disclosure that the chargeability information illustrated in FIG. 13 are examples only and that additional types of chargeability information can be transmitted to the blockchain BC at additional stages with the vehicle maker.

Figure 14:
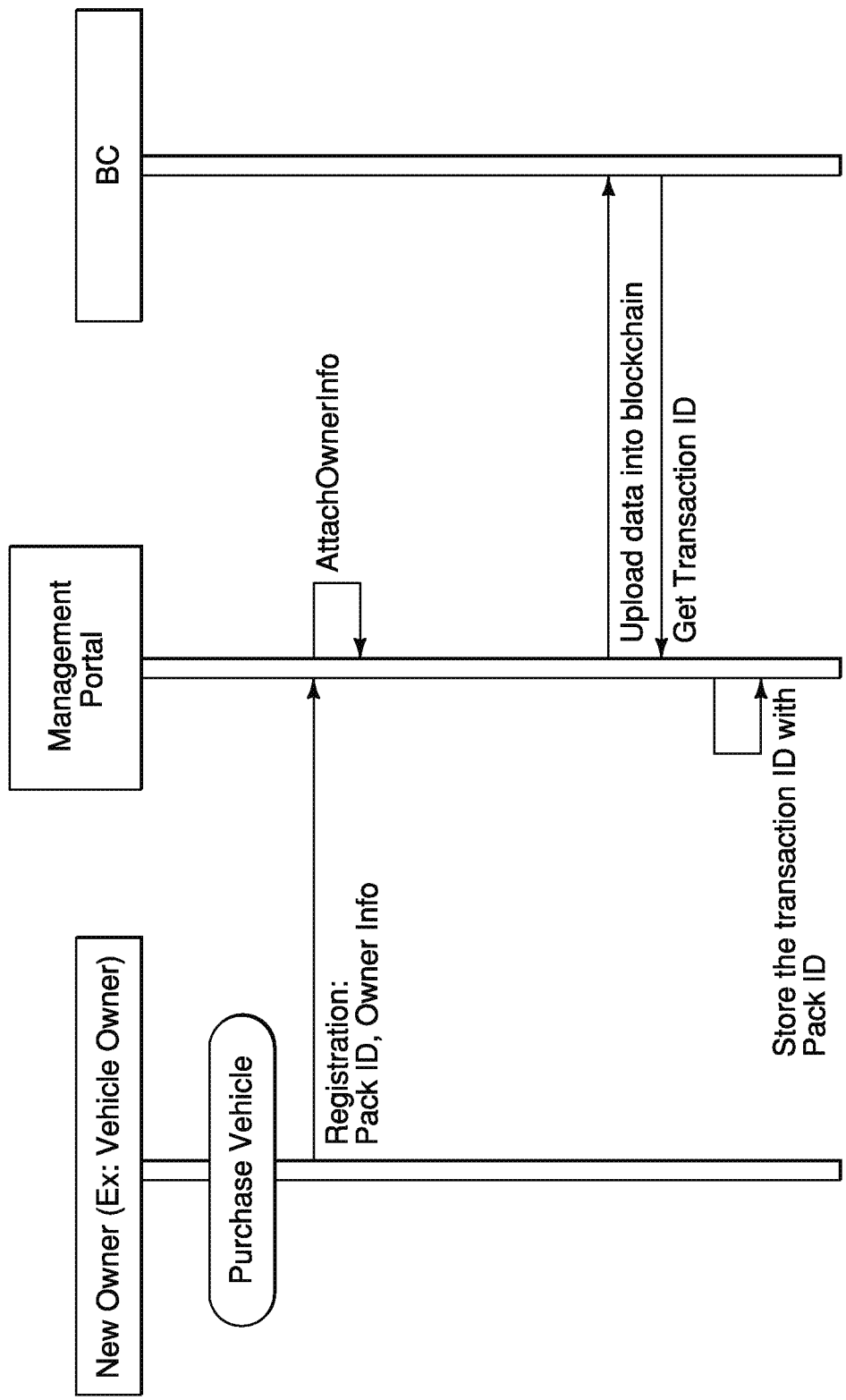
FIG. 14 is a flowchart illustrating an example of a third scenario in which chargeability information is uploaded to the external database.

FIG. 14 illustrates an example in which a purchaser of the vehicle 12 equipped with the EVB 14 uploads chargeability information to the external memory storage 24, such as the blockchain BC. Similar to the scenario in FIGS. 12 and 13, the chargeability information can be uploaded via a management portal, such as a user app. In this scenario, the purchaser of the vehicle 12 can upload chargeability information during purchase of the vehicle 12. For example, the ECU of the vehicle 12 can be equipped to automatically upload chargeability information related to the EVB 12 when the vehicle 12 is turned ON. It will be apparent to those skilled in the vehicle field from this disclosure that the chargeability information illustrated in FIG. 14 are examples only and that additional types of chargeability information can be transmitted to the blockchain BC at additional stages with the purchaser of the vehicle 12.

Figure 15:
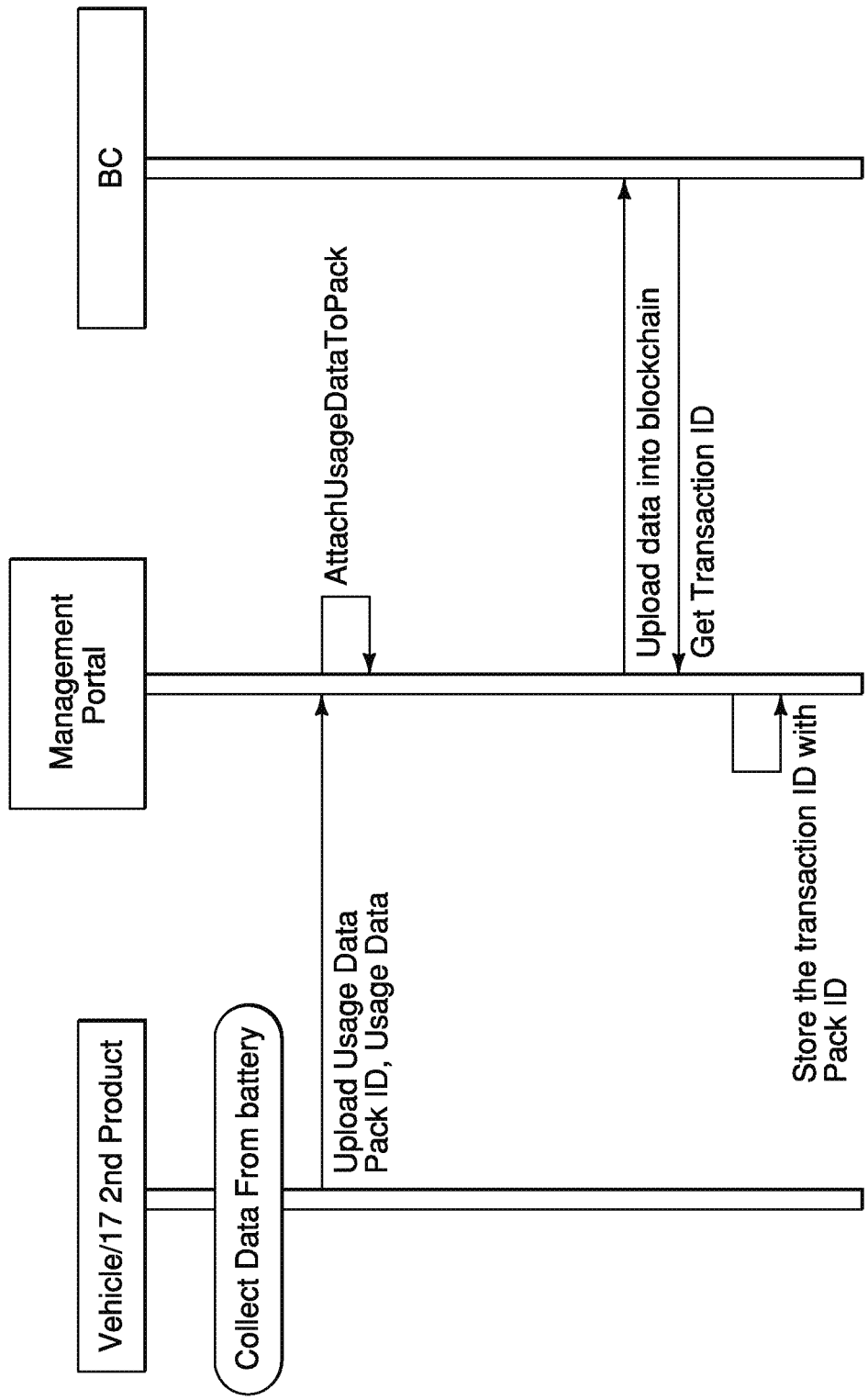
FIG. 15 is a flowchart illustrating an example of a fourth scenario in which chargeability information is uploaded to the external database.

FIG. 15 illustrates an example in which the vehicle 12 equipped with the EVB 14 is sold to a secondary purchaser. In this scenario, the second purchaser uploads chargeability information to the external memory storage 24, such as the blockchain BC. The chargeability information can be uploaded via a management portal, such as a user app. In this scenario, the second purchaser of the vehicle 12 can upload chargeability information during secondary purchase of the vehicle 12 manually via operation of the management portal app. Alternatively, the ECU of the vehicle 12 can be equipped to automatically upload chargeability information related to the EVB 14 when the vehicle 12 is turned ON. It will be apparent to those skilled in the vehicle field from this disclosure that the chargeability information illustrated in FIG. 15 are examples only and that additional types of chargeability information can be transmitted to the blockchain BC at additional stages with the second purchaser.

Figure 16:
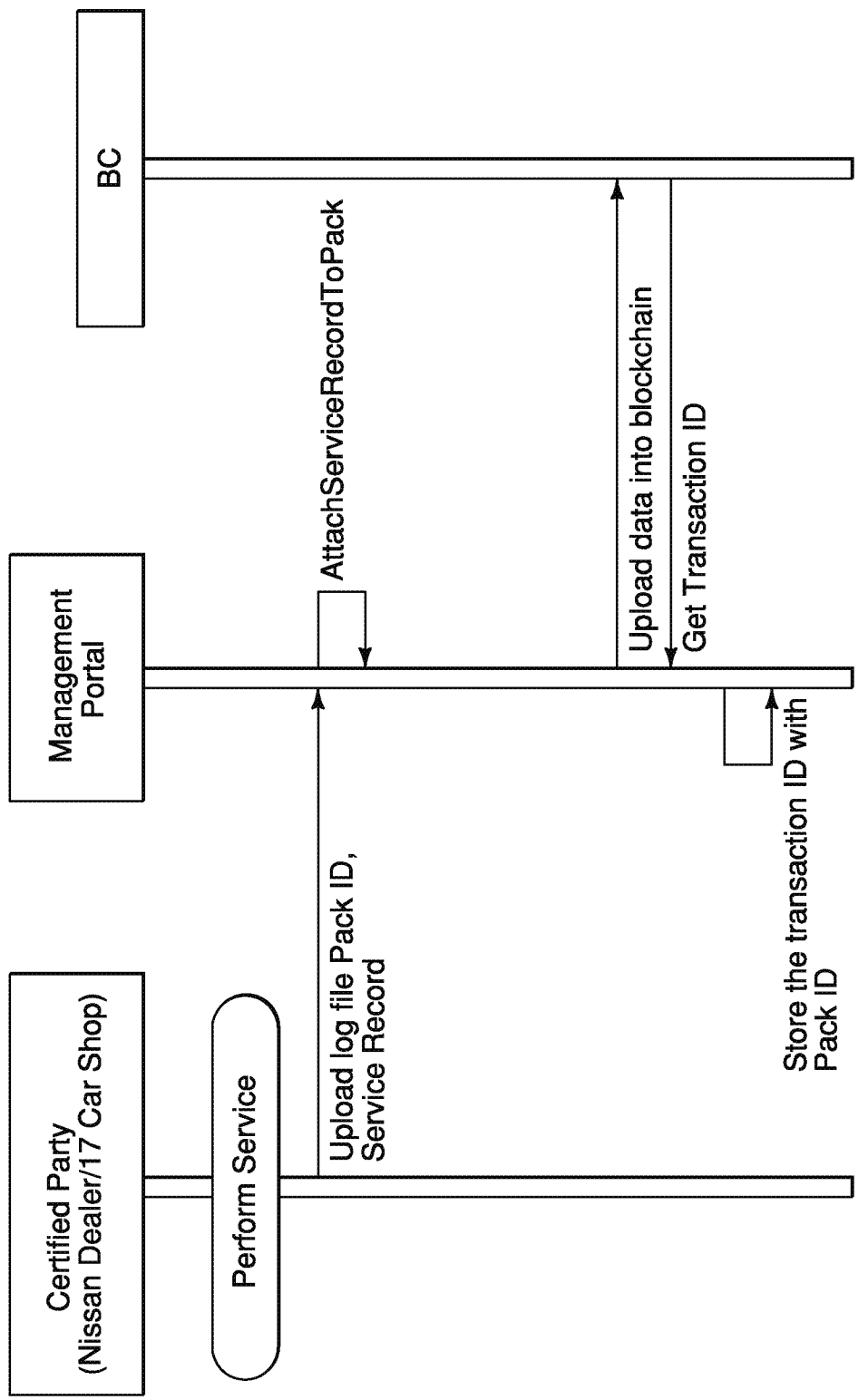
FIG. 16 is a flowchart illustrating an example of a fifth scenario in which chargeability information is uploaded to the external database.

FIG. 16 illustrates an example in which a dealer of the vehicle 12 equipped with the EVB 14, or a repair shop uploads the chargeability information to the external memory storage 24, such as the blockchain BC. The chargeability information can be uploaded via a management portal, such as a user app. In this scenario, the dealer or the repair shop worker working on the vehicle 12 can upload chargeability information during service of the vehicle 12. For example, the ECU of the vehicle 12 can be equipped to automatically upload chargeability information related to the EVB 12 when the vehicle 12 is turned ON. Alternatively, the dealer or the repair person can choose to upload the information via the management portal operation. It will be apparent to those skilled in the vehicle field from this disclosure that the chargeability information illustrated in FIG. 16 are examples only and that additional types of chargeability information can be transmitted to the blockchain BC at additional stages with the dealer or the repair shop.

Figure 17:
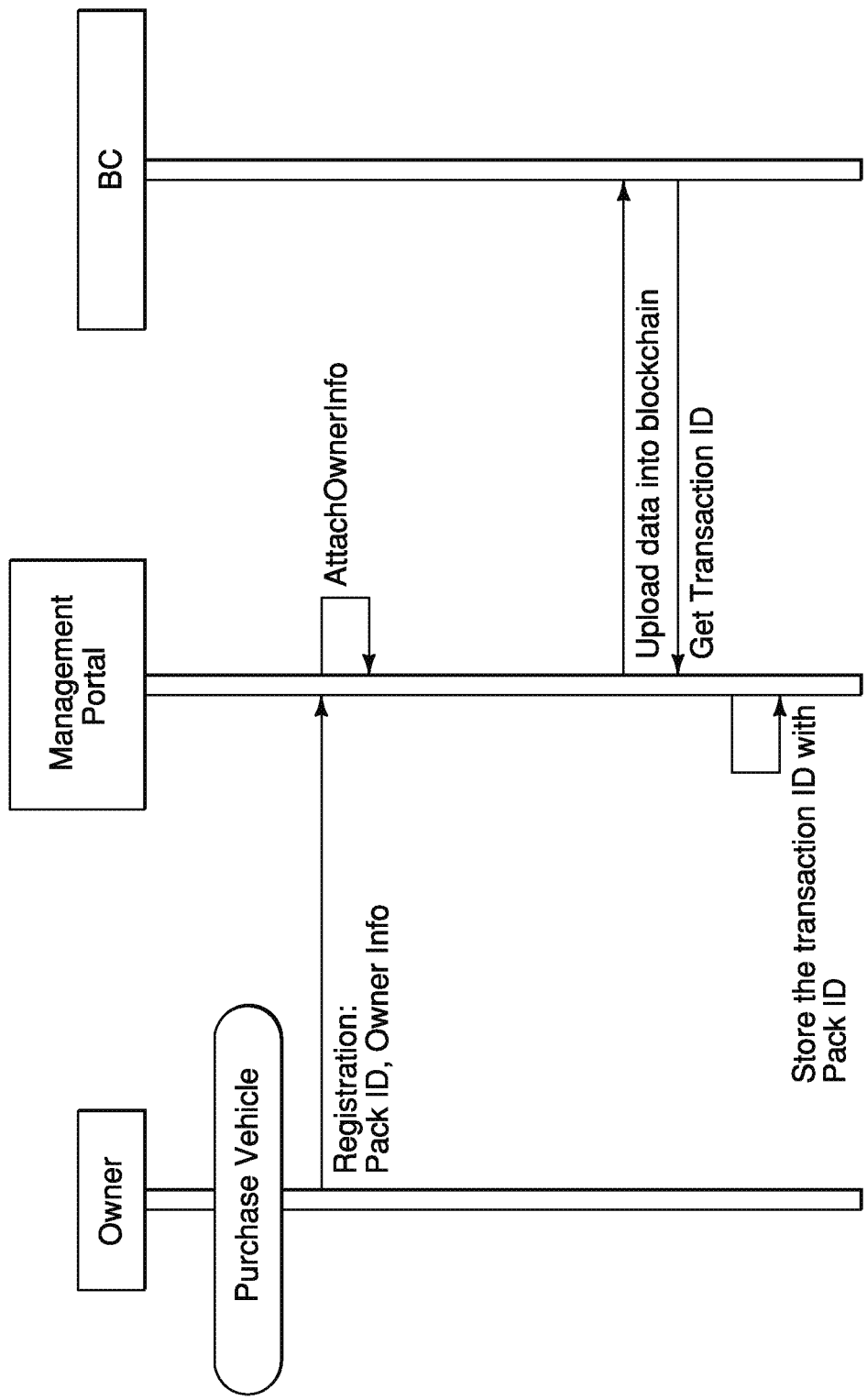
FIG. 17 is a flowchart illustrating an example of a sixth scenario in which chargeability information is uploaded to the external database

FIG. 17 illustrates an example in which the owner of the vehicle 12 equipped with the EVB 14, uploads the chargeability information to the external memory storage 24, such as the blockchain BC. The chargeability information can be uploaded via a management portal, such as a user app. The chargeability information can be uploaded at various instances with the owner, such as described herein the application above. It will be apparent to those skilled in the vehicle field from this disclosure that the chargeability information illustrated in FIG. 17 are examples only and that additional types of chargeability information can be transmitted to the blockchain BC at additional stages with the owner.

Figure 18:
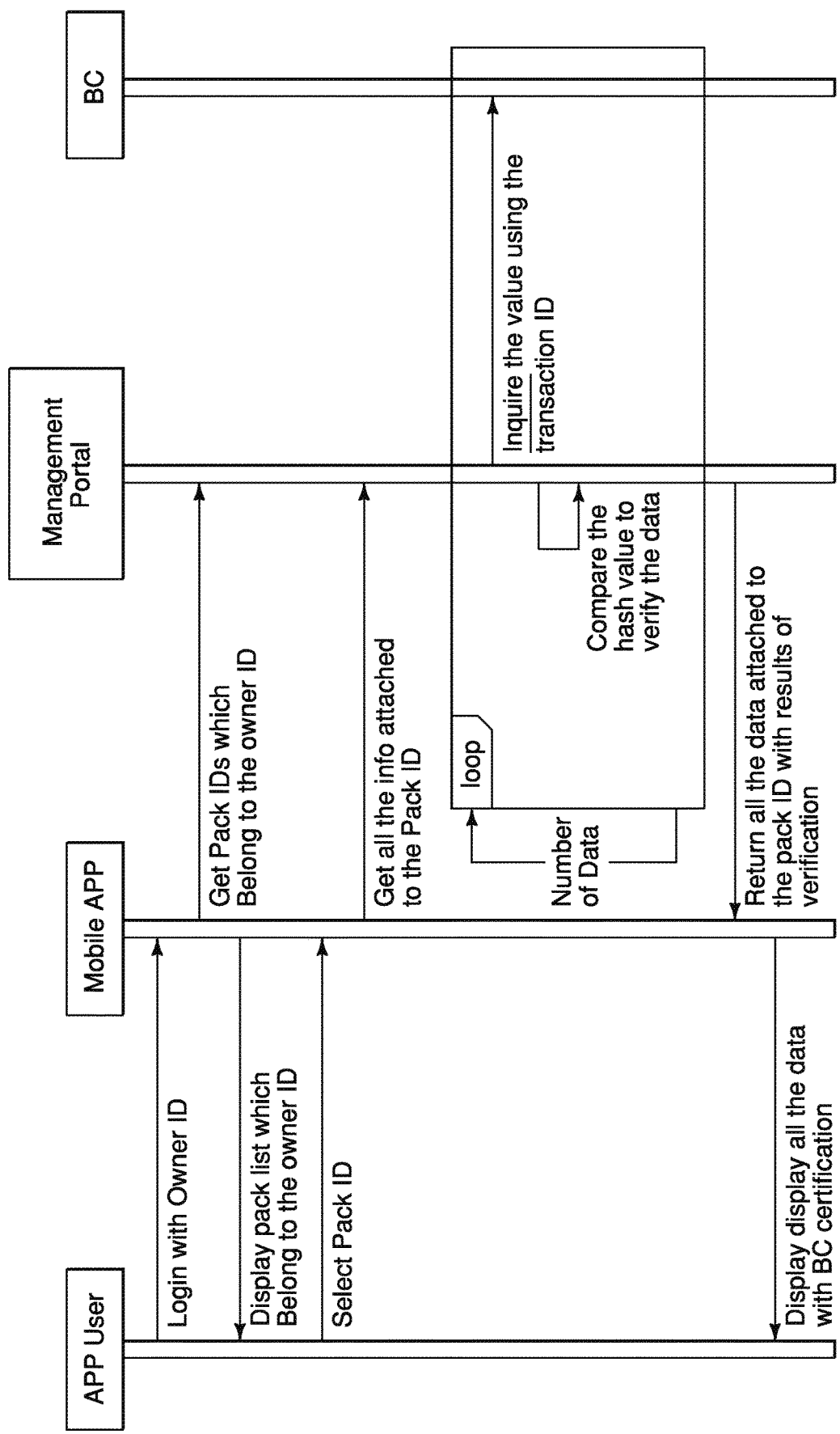
FIG. 18 is a flowchart illustrating an example of a seventh scenario in which chargeability information is uploaded to the external database.

FIG. 18 illustrates an example a user of an app uploads chargeability information related to the vehicle 12 equipped with the EVB 14 to the external memory storage 24, such as the blockchain BC, via use of an app on a mobile device. This scenario illustrated in FIG. 18 can be illustrative of uploading chargeability information by various parties, such as the EVB 14 manufacturer, the maker of the vehicle 12, the purchaser and downstream purchasers of the vehicle 12, etc.

Figure 19:
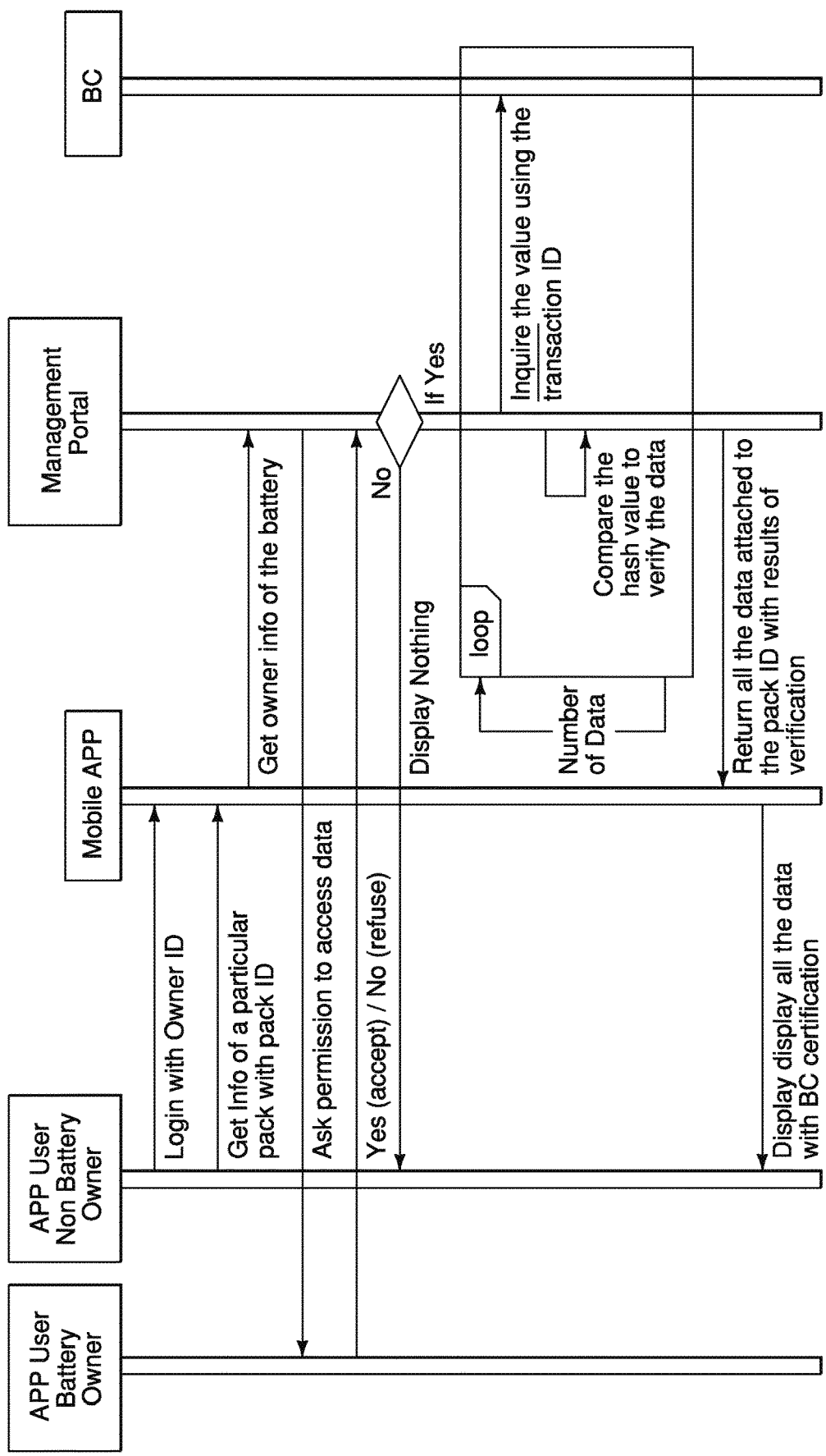
FIG. 19 is a flowchart illustrating an example of an eighth scenario in which chargeability information is uploaded to the external database.

FIG. 19 illustrates an example a user of an app uploads chargeability information related to the vehicle 12 equipped with the EVB 14 to the external memory storage 24, such as the blockchain BC, via use of an app on a mobile device. FIG. 19 also illustrates the scenario in which an owner of the EVB 14 can upload and receive chargeability information, as well as a non-owner of the EVB 14. For example, if someone is considering purchase of the vehicle 12 of purchase/recycling of the EVB 14, the non-owner an access chargeability information stored in the blockchain BC to learn the history of the EVB. This scenario illustrated in FIG. 19 can be illustrative of uploading chargeability information by various parties, such as the EVB 14 manufacturer, the maker of the vehicle 12, the purchaser and downstream purchasers of the vehicle 12, etc.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Accordingly, these terms, as utilized to describe the present invention should be interpreted relative to a vehicle equipped with the battery life tracking system.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A vehicle battery life tracking system comprising:
a vehicle battery having a plurality of individual battery units;
an electronic control unit for a vehicle having the vehicle battery, the electronic control unit being programmed to monitor and store chargeability information associated with the individual battery units; and
a wireless communication unit provided to the vehicle, the electronic control unit being configured to control the wireless communication unit to upload the chargeability information to an external memory storage that is a blockchain ledger upon the occurrence of one or more predetermined incidents, the predetermined incidents at least including scanning any one of the electronic identification tags.

2. The vehicle battery life system according to claim 1, wherein
the individual battery units include at least one of a group consisting of battery cells, battery modules, and battery packs for the vehicle battery.

3. The vehicle battery life system according to claim 2, wherein
each of the individual battery units are provided with an identification tag.

4. The vehicle battery life system according to claim 1, wherein
the predetermined incidents include turning the vehicle ON.

5. The vehicle battery life system according to claim 1, wherein
the predetermined incidents include charging the vehicle battery.

6. The vehicle battery life system according to claim 1, wherein
the electronic control unit is programmed to provide a time stamp associated with each upload.

7. The vehicle battery life system according to claim 1, wherein
the chargeability information includes temperature information of the plurality of individual battery units.

8. The vehicle battery life system according to claim 1, wherein
the chargeability information includes internal resistance condition of the plurality of individual battery units.

9. The vehicle battery life system according to claim 1, wherein
the chargeability information includes chargeability history of the plurality of individual battery units.

10. The vehicle battery life system according to claim 1, wherein
the electronic control unit includes memory for storing the chargeability information associated with the plurality of individual battery units.

11. A vehicle, comprising:
a vehicle battery comprised of a plurality of individual battery units;
an electronic control unit for the vehicle, the electronic control unit being programmed to monitor and store chargeability information associated with the individual battery units; and
a wireless communication unit configured to upload the chargeability information to an external memory storage that is a blockchain ledger upon the occurrence of pre-determined incidents, the predetermined incidents at least including scanning any one of the electronic identification tags.

12. The vehicle according to claim 11, wherein
the individual battery units include at least one of a group consisting of battery cells, battery modules, and battery packs for the vehicle battery.

13. The vehicle according to claim 12, wherein
each of the individual battery units are provided with an electronic identification tag.

14. The vehicle according to claim 13, wherein
the remote storage medium is a blockchain ledger.

15. The vehicle according to claim 14, further comprising a display, the electronic control unit being programmed to send a notification alert to the display upon determining that the chargeability of any of the individual battery units is below a threshold level.

16. The vehicle according to claim 14, further comprising at least one voltage detector for detecting the voltage of the individual battery units.

17. The vehicle according to claim 14, further comprising at least one temperature detector for detecting the temperature of the individual battery units.

18. A vehicle, comprising:

a vehicle battery comprised of a plurality of individual battery units, the individual battery units including at least one of a group consisting of battery cells, battery modules, and battery packs for the vehicle battery, each of the individual battery units being provided with an electronic identification tag;

an electronic control unit for the vehicle, the electronic control unit being programmed to monitor and store chargeability information associated with the individual battery units; and a wireless communication unit configured to upload the chargeability information to an external memory storage that is a blockchain ledger upon the occurrence of pre-determined incidents, the electronic control unit being programmed to send a termination signal to terminate charging of the vehicle battery upon determining that the chargeability of any of the individual battery units is below a threshold level.

* * * * *